(12) United States Patent
Nakanishi et al.

(10) Patent No.: US 10,209,414 B2
(45) Date of Patent: *Feb. 19, 2019

(54) INFRARED-REFLECTING FILM

(71) Applicant: NITTO DENKO CORPORATION, Ibaraki-shi, Osaka (JP)

(72) Inventors: Yosuke Nakanishi, Ibaraki (JP); Yutaka Ohmori, Ibaraki (JP); Masahiko Watanabe, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/501,313

(22) PCT Filed: Aug. 3, 2015

(86) PCT No.: PCT/JP2015/071938
§ 371 (c)(1),
(2) Date: Feb. 2, 2017

(87) PCT Pub. No.: WO2016/021543
PCT Pub. Date: Feb. 11, 2016

(65) Prior Publication Data
US 2017/0219750 A1    Aug. 3, 2017

(30) Foreign Application Priority Data

Aug. 5, 2014  (JP) .................... 2014-159868

(51) Int. Cl.
*G02B 5/26*    (2006.01)
*G02B 5/28*    (2006.01)
(Continued)

(52) U.S. Cl.
CPC .............. *G02B 5/208* (2013.01); *B32B 7/02* (2013.01); *B32B 9/00* (2013.01); *B32B 15/04* (2013.01);
(Continued)

(58) Field of Classification Search
None
See application file for complete search history.

(56) References Cited

U.S. PATENT DOCUMENTS 4,548,691 A    10/1985  Dietrich et al.
4,590,118 A *  5/1986   Yatabe ............... G02B 5/208
                                                  428/215
(Continued)

FOREIGN PATENT DOCUMENTS

CN    87 1 05971 A     8/1988
CN    102834258 A     12/2012
(Continued)

OTHER PUBLICATIONS

International Preliminary Report on Patentability dated Feb. 7, 2017 for PCT/JP2015/071921.
(Continued)

*Primary Examiner* — Z. Jim Yang
(74) *Attorney, Agent, or Firm* — Hauptman Ham, LLP

(57) ABSTRACT

Infrared reflecting film includes, on a transparent film substrate, a metal oxide layer, an infrared reflecting layer mainly made of silver, and a light absorptive metal layer, in this order. No metal layer is disposed between the transparent film substrate and the infrared reflecting layer. The metal oxide layer is preferably formed of a composite metal oxide including zinc oxide and tin oxide. The light absorptive metal layer has a thickness of 2 nm to 10 nm and includes at least one selected from the group consisting of nickel, chromium, niobium, tantalum, and titanium.

15 Claims, 2 Drawing Sheets

(51) Int. Cl.
| | |
|---|---|
| G02B 5/20 | (2006.01) |
| G02B 5/22 | (2006.01) |
| B32B 7/02 | (2006.01) |
| B32B 9/00 | (2006.01) |
| B32B 15/04 | (2006.01) |
| C03C 17/36 | (2006.01) |
| C08J 7/04 | (2006.01) |
| C23C 14/08 | (2006.01) |

(52) U.S. Cl.
CPC ........ *C03C 17/366* (2013.01); *C03C 17/3639* (2013.01); *C03C 17/3644* (2013.01); *C03C 17/3681* (2013.01); *C08J 7/045* (2013.01); *C23C 14/086* (2013.01); *G02B 5/22* (2013.01); *G02B 5/223* (2013.01); *G02B 5/26* (2013.01); *B32B 2307/416* (2013.01); *B32B 2309/105* (2013.01)

(56) References Cited

U.S. PATENT DOCUMENTS

| | | | |
|---|---|---|---|
| 4,716,086 A | 12/1987 | Gillery et al. | |
| 4,806,220 A | 2/1989 | Finley | |
| 5,229,881 A * | 7/1993 | Day | B32B 17/06 204/192.27 |
| 5,513,040 A * | 4/1996 | Yang | G02B 5/20 359/585 |
| 5,948,538 A * | 9/1999 | Brochot | C03C 17/36 359/359 |
| 6,007,901 A * | 12/1999 | Maschwitz | C03C 17/36 359/580 |
| 9,242,895 B2 * | 1/2016 | Disteldorf | C03C 17/3441 |
| 2006/0046018 A1 * | 3/2006 | Lemmer | C03C 17/36 428/68 |
| 2006/0246300 A1 * | 11/2006 | Hevesi | C03C 17/36 428/432 |
| 2007/0082169 A1 * | 4/2007 | Hartig | C03C 17/36 428/69 |
| 2007/0248756 A1 * | 10/2007 | Krisko | C03C 17/002 427/255.15 |
| 2007/0281178 A1 * | 12/2007 | Oh | C03C 17/36 428/469 |
| 2008/0074737 A1 * | 3/2008 | Dai | C03C 17/38 359/359 |
| 2008/0193686 A1 * | 8/2008 | Loergen | B32B 17/10 428/34 |
| 2008/0311389 A1 * | 12/2008 | Roguiny | C03C 17/36 428/336 |
| 2009/0047466 A1 * | 2/2009 | German | C03C 17/36 428/98 |
| 2009/0233037 A1 * | 9/2009 | Medwick | C03C 17/36 428/68 |
| 2009/0274901 A1 * | 11/2009 | Roquiny | C03C 17/36 428/336 |
| 2010/0255294 A1 * | 10/2010 | Yaoita | C03C 17/3435 428/336 |
| 2010/0316852 A1 | 12/2010 | Condo et al. | |
| 2011/0300319 A1 * | 12/2011 | Reymond | C03C 17/36 428/34 |
| 2011/0308693 A1 * | 12/2011 | Van Nutt | B32B 17/1022 156/60 |
| 2012/0052320 A1 | 3/2012 | Van Nutt et al. | |
| 2012/0219821 A1 * | 8/2012 | Frank | C03C 17/36 428/630 |
| 2012/0225317 A1 * | 9/2012 | Imran | C03C 17/36 428/630 |
| 2013/0004727 A1 * | 1/2013 | Inagaki | B32B 17/10036 428/172 |
| 2013/0105069 A1 * | 5/2013 | Van Nutt | B32B 15/08 156/187 |
| 2013/0170059 A1 * | 7/2013 | Lingle | C03C 17/3642 359/884 |
| 2013/0279000 A1 * | 10/2013 | Maeda | B32B 17/10018 359/360 |
| 2014/0072784 A1 * | 3/2014 | Dietrich | B32B 5/00 428/213 |
| 2014/0101919 A1 | 4/2014 | Van Nutt et al. | |
| 2014/0240822 A1 * | 8/2014 | Ohmori | B32B 7/02 359/360 |
| 2014/0363685 A1 * | 12/2014 | Okawa | C03C 17/36 428/457 |
| 2015/0140355 A1 * | 5/2015 | Suzuki | B32B 7/02 428/623 |
| 2015/0190989 A1 * | 7/2015 | Inuduka | G02B 5/26 428/336 |
| 2015/0321951 A1 * | 11/2015 | Alzate | C03C 17/36 428/34 |
| 2016/0003989 A1 | 1/2016 | Watanabe et al. | |
| 2016/0207826 A1 * | 7/2016 | Kim | C09D 1/00 |
| 2016/0257611 A1 * | 9/2016 | Noethe | C03C 17/3639 |
| 2016/0354995 A1 * | 12/2016 | Lienhart | B32B 15/04 |

FOREIGN PATENT DOCUMENTS

| | | |
|---|---|---|
| EP | 0 275 474 A1 | 7/1988 |
| EP | 2 542 405 A | 1/2013 |
| EP | 2 750 885 A | 7/2014 |
| JP | 59-165001 A | 9/1984 |
| JP | 61-111940 A | 5/1986 |
| JP | 63-183164 A | 7/1988 |
| JP | 1-206035 A | 8/1989 |
| JP | H1-301537 A | 12/1989 |
| JP | H8-336923 A | 12/1996 |
| JP | 2000-192227 A | 7/2000 |
| JP | 2001-33622 A | 2/2001 |
| JP | 2012037634 A | 2/2012 |
| JP | 2013-521160 A | 6/2013 |
| JP | 2014194535 A | 10/2014 |
| WO | 2011/109306 A2 | 9/2011 |
| WO | WO-2012096304 A1 * | 7/2012 ....... B32B 17/10018 |
| WO | 2013/032542 A1 | 3/2013 |
| WO | 2014/119677 A1 | 8/2014 |

OTHER PUBLICATIONS

International Search Report dated Oct. 27, 2015 corresponding to International Application PCT/JP2015/071938.
International Preliminary Report on Patentability dated Feb. 16, 2017 for PCT/JP2015/071938.
Japanese Office Action dated Feb. 6, 2018 for corresponding Japanese Application No. 2014-159868.
Chinese Office Action dated Jul. 2, 2018 for corresponding Korean Application No. 201580041997.8.
Korean Office Action dated Jul. 5, 2018 for corresponding Korean Application No. 10-2017-7005394.
Korean Office Action dated Jan. 30, 2018 for corresponding Korean Application No. 10-2017-7005394.
Asahi Glass Co. Ltd, Database WPI, Week 201217, Solar Radiate Adjust Film Glass Reflect Lainate Obtain Zinc Oxide Layer Silver Alloy Contain Palladium Gold, Thomson Scientific, an 2012-C46645, London, GB, OPD:Aug. 5, 2010, PD:Feb. 23, 2012.
The extended European Search Report for PCT/JP2015071938 dated Dec. 5, 2017.
Singapore Office Action dated Jul. 10, 2017 from IPOS in connection with the counterpart Singapore Patent Application No. 11201700854Y.

* cited by examiner

INFRARED-REFLECTING FILM

CROSS REFERENCE TO RELATED APPLICATION

This application claims the benefit of Japanese Patent Application No. 2014-159868, filed on Aug. 5, 2014, in the JPO (Japanese Patent Office). Further, this application is the National Phase application of International Application No. PCT/JP2015/071938, filed Aug. 3, 2015, which designates the United States and was published in Japan. Both of the priority documents are hereby incorporated by reference in their entireties.

TECHNICAL FIELD

The invention relates to an infrared reflecting film having thin-films including infrared reflecting layer etc. on a transparent film substrate.

BACKGROUND ART

Heretofore, an infrared reflecting substrate having an infrared reflecting layer on a substrate of glass, film or the like is known. As the infrared reflecting layer, a metal layer such as silver is widely used from the viewpoint of enhancing the selective reflectivity of infrared rays. In an infrared reflecting substrate, a configuration in which a metal layer serving as an infrared reflecting layer and a metal oxide layer are alternately stacked is widely adopted to allow wavelength-selective transmission of visible light. In an infrared reflecting film using a film substrate, a transparent protective layer (top coat layer) made of resin is disposed on the surface of the infrared reflecting layer at a side opposite to the substrate, for the purpose of chemically protecting these metal layers and metal oxide layers.

In the infrared reflecting substrate, the metal layer of silver or the like reflects near-infrared rays such as solar light to impart heat shielding properties. On the other hand, in order to allow the infrared reflecting substrate to have heat insulating properties, it is important to reduce the emittance and to reflect far-infrared rays to the interior of a room by the infrared reflecting layer. Since a resin layer (organic material) used as the transparent protective layer of the infrared reflecting layer generally contains C=C bonds, C=O bonds, C—O bonds or aromatic rings, infrared vibration absorption of a far-infrared ray region of a wavelength of 5 μm to 25 μm is large. The far-infrared ray absorbed at the resin layer is dissipated outdoors as heat due to thermal conduction without being reflected at the metal layer. Therefore, when an amount of the far-infrared rays absorbed by the protective layer is large, the emittance is increased and the heat insulating effect is not achieved.

For the purpose of reducing the emittance of the infrared reflecting film, Patent Document 1 proposes reduction of far-infrared ray absorption caused by the protective layer with using a protective layer made of an Si-based material such as polysilazane, fluoroalkylsilane, or fluorosilane and setting the thickness thereof to be 500 nm or less. On the other hand, when the thickness of the protective layer is reduced, a chemical protecting effect on the infrared reflecting layer tends to decrease thereby leading to decrease in the durability of the infrared reflecting layer. In particular, silver is low in durability against oxygen, moisture, chlorine, and the like, so that, when an infrared reflecting layer mainly made of silver is degraded, the emittance of the infrared reflecting film tends to rise (the heat insulating properties decrease).

For this reason, Patent Document 1 proposes to improve the durability of the infrared reflecting layer by adopting a configuration in which the infrared reflecting layer made of a metal such as silver is interposed between metal layers having a high durability such as a Ni—Cr alloy.

PRIOR ART DOCUMENTS

Patent Documents

Patent Document 1: WO2011/109306 (FIG. 2 and others)

SUMMARY OF THE INVENTION

Problems to be Solved by the Invention

According to the investigations made by the present inventors, it has been found out that an infrared reflecting film having a configuration in which an infrared reflecting layer is interposed between metal layers of Ni—Cr or the like, as disclosed in Patent Document 1, is liable to generate releasing of the infrared reflecting layer from the film substrate and in particular has a low durability against finger fat components, though being excellent in the property of protecting the infrared reflecting layer.

As a method for enhancing the durability against finger fat, it can be considered to increase the chemical durability by increasing the thicknesses of the metal layer of Ni—Cr or the like or the metal oxide layer formed on the infrared reflecting layer of Ag or the like. However, when the thickness of the light absorptive metal layer of Ni—Cr or the like is increased, the visible light transmittance of the infrared reflecting film decreases, and the transparency is lost. Further, in order to enhance the durability by increasing the thickness of the metal oxide layer, a large increase of the thickness is needed as compared with the case of increasing the thickness of the light absorptive metal layer of Ni—Cr or the like. The metal oxides have a low electric conductivity of a sputtering target and thus the deposition rate by sputtering is low. When it is intended to enhance the durability by increasing the thickness of the metal oxide layer, there is a problem in that the productivity of the infrared reflecting film considerably decreases.

Thus, in conventional technologies, it is difficult to obtain an infrared reflecting film being excellent in durability against finger fat and the like and in visibility (transparency) without decreasing the productivity. In view of the above-mentioned situation, an object of the present invention is to provide an infrared reflecting film that hardly generates releasing between the film substrate and the infrared reflecting layer and is excellent in visibility and productivity.

Means for Solving the Problems

The present inventors have made detailed investigations on a situation of releasing between the film substrate and the infrared reflecting layer and have found out that, in an infrared reflecting film after being immersed into a finger fat component, releasing is generated at an interface between the film substrate and the metal layer (Ni—Cr alloy layer). From this result, it has been inferred that a low adhesion between the film substrate and the metal layer is a cause of the releasing. Based on this inference, the present inventors have made further investigations and have consequently found out that the releasing at the interface can be suppressed by forming a specific metal oxide layer on the film substrate with a cured resin layer interposed therebetween and forming an infrared reflecting layer thereon without a light absorptive metal layer such as a Ni—Cr alloy layer interposed therebetween.

The present invention pertains to an infrared reflecting film including a metal oxide layer, an infrared reflecting layer mainly made of silver, and a light absorptive metal layer in this order on a transparent film substrate. In the infrared reflecting film of the present invention, the transparent film substrate includes a cured resin layer on the surface at the oxide layer forming side. The metal oxide layer disposed between the film substrate and the infrared reflecting layer is preferably made of a composite metal oxide containing zinc oxide and tin oxide.

It is preferable that the infrared reflecting film of the present invention does not have a metal layer between the transparent film substrate and the infrared reflecting layer. The light absorptive metal layer formed on the infrared reflecting layer preferably has a thickness of 2 nm to 10 nm. Further, the light absorptive metal layer preferably contains at least one selected from the group consisting of nickel, chromium, niobium, tantalum and titanium.

In the infrared reflecting film of the present invention, it is preferable that the cured resin layer of the transparent film substrate and the metal oxide layer are in direct contact with each other. Further, it is preferable that the metal oxide layer and the infrared reflecting layer are in direct contact with each other.

The metal oxide layer disposed between the film substrate and the infrared reflecting layer preferably has a thickness of 2 nm to 15 nm. Further, in the infrared reflecting film of the present invention, it is preferable that a sum of the thicknesses of the metal layer and the metal oxide layer on the transparent film substrate is 50 nm or less.

In the infrared reflecting film of the present invention, it is preferable that a transparent resin layer is further provided on the surface of the light absorptive metal layer at a side opposite to the infrared reflecting layer. The infrared reflecting film of the present invention may further include a metal oxide between the light absorptive metal layer and the transparent resin layer.

The infrared reflecting film of the present invention preferably has a visible light transmittance of 10% to 50%.

Effects of the Invention

Since the infrared reflecting film of the present invention has a specific metal oxide layer between the transparent film substrate and the infrared reflecting layer, releasing of the infrared reflecting layer from the film substrate is suppressed even when a finger fat or the like penetrates into the infrared reflecting film. Further, since the light absorptive metal layer is provided on the infrared reflecting layer, degradation of the infrared reflecting layer is suppressed, and also an effect of improving the visibility by reduction of the reflectance can be expected.

The infrared reflecting film of the present invention does not have a metal layer between the transparent film substrate and the infrared reflecting layer and has a front-back asymmetric configuration in which a metal layer is provided only on the front surface side of the infrared reflecting layer. Regarding this configuration, layer configuration is designed so as to satisfy the characteristics that are respectively needed in the front and in the back of the infrared reflecting layer, so that the number of stacking the metal layers and the metal oxide layers or the total thickness thereof can be reduced to enhance the productivity. In other words, the infrared reflecting film of the present invention is excellent in durability and visibility as well as in productivity.

MODE FOR CARRYING OUT THE INVENTION

Figure 1:
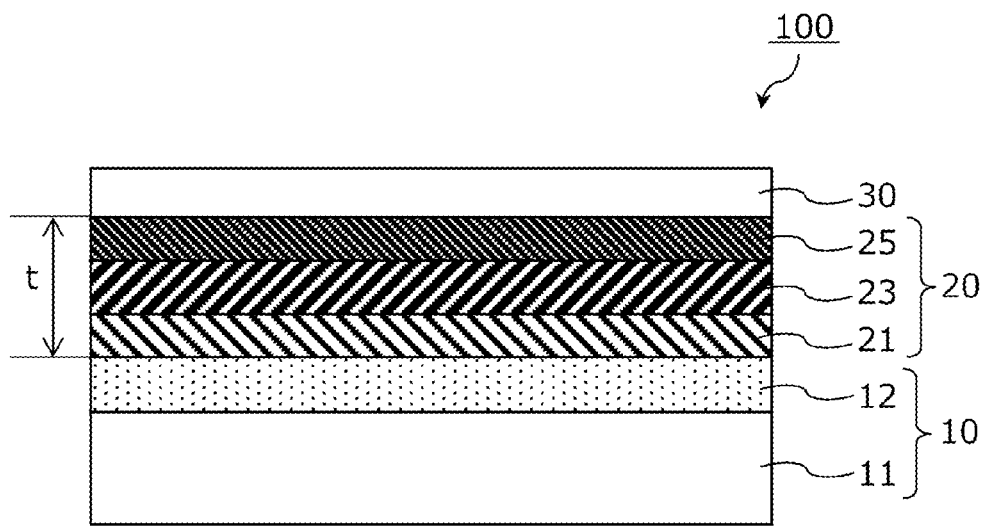
FIG. 1 is a schematic cross-sectional view showing a stacking configuration of an infrared reflecting film according to one embodiment.

FIG. 1 is a schematic cross-sectional view showing a configuration example of an infrared reflecting film. As shown in FIG. 1, an infrared reflecting film 100 includes a functional thin-film 20 on one principal surface of a transparent film substrate 10. It is preferred that a transparent protective layer 30 is formed on the functional thin-film 20.

Figure 3:
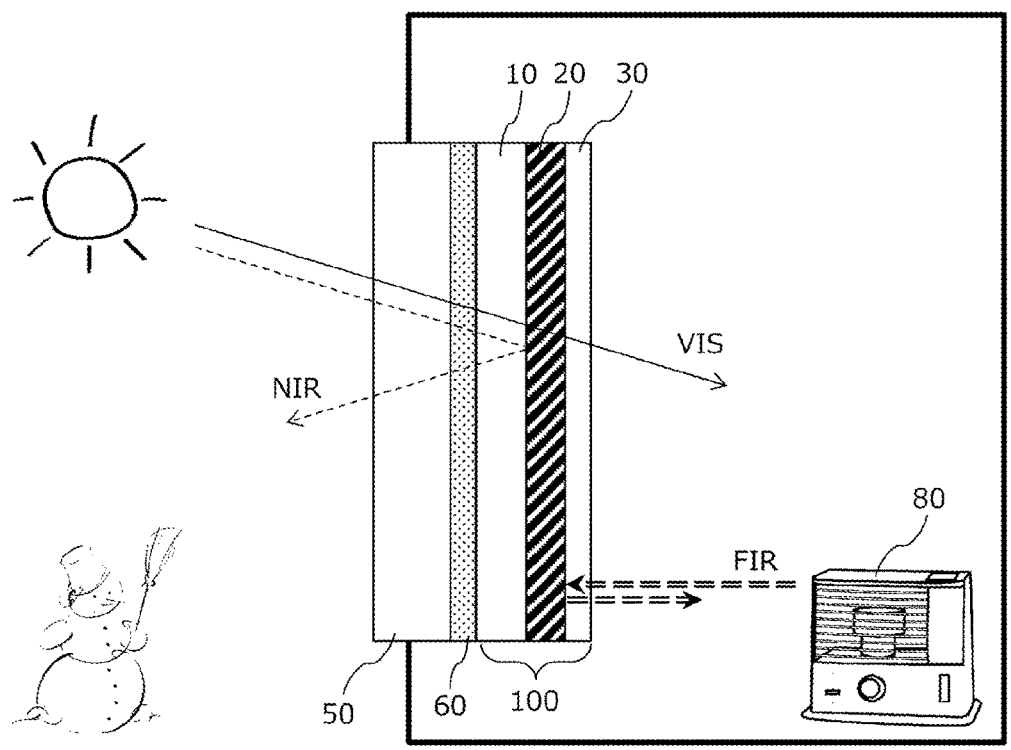
FIG. 3 is a schematic cross-sectional view showing a usage example of an infrared reflecting film.

FIG. 3 is a schematic cross-sectional view showing a usage example of the infrared reflecting film. In this usage example, a transparent film substrate 10 side of the infrared reflecting film 100 is bonded to a window 50 with an appropriate adhesive layer 60 interposed therebetween and the infrared reflecting film 100 is arranged on an interior side of a window 50 of buildings or automobiles to be used. As schematically shown in FIG. 3, the infrared reflecting film 100 transmits visible light (VIS) from the outdoors to introduce the light to the interior, and reflects near-infrared rays (NIR) from the outdoors at the infrared reflecting layer in the functional thin-film 20. Since heat flow from the outdoors to the interior resulting from sunlight or the like is suppressed (heat shielding effect is exerted) by the reflection of near-infrared rays, efficiency of the air conditioning in summer can be increased. Moreover, since the infrared reflecting layer reflects indoor far-infrared rays (FIR) emitted from a heating appliance 80 etc., a heat insulating effect is exerted and efficiency of heating in winter can be increased.

Hereinafter, preferred structures and materials for each layer are successively described.

[Transparent Film Substrate]

A flexible transparent film is used as the transparent film substrate 10. The transparent film substrate preferably has a visible light transmittance of 80% or more. The visible light transmittance is measured according to JIS A 5759-2008 (Adhesive films for glazings).

It is preferable that the transparent film substrate 10 includes a cured resin layer 12 on the surface of a transparent film 11 at a side where the functional thin-film 20 is formed. When the transparent film substrate 10 includes a cured resin layer, the mechanical strength of the infrared reflecting film is enhanced. Further, when the transparent film substrate 10 includes the cured resin layer 12 on the functional thin-film 20-forming surface, the abrasion resistance of the functional thin-film 20 and the transparent protective layer formed thereon tends to be enhanced.

The thickness of the transparent film substrate 10 is not particularly limited. Thickness range of about 10 μm to 300 μm is suitable. Further, since there may be cases where high temperature processes are performed in formation of functional thin-film 20 on the transparent film substrate 10, a resin material constituting the transparent film 11 preferably has excellent heat resistance. Examples of the resin material constituting the transparent film substrate include polyethylene terephthalate (PET), polyethylene naphthalate (PEN), polyether ether ketone (PEEK), polycarbonate (PC) and the like. The cured resin layer 12 can be formed, for example, by a method in which a cured coating of an appropriate ultraviolet-curable resin, such as acryl-based resin or silicone-based resin, is provided on the transparent film 11. The cured resin layer 12 with high hardness is suitably used.

For the purpose of increasing the adhesion, the functional thin-film 20-forming surface of the transparent film substrate 10 may be subjected to a surface modification treatment such as corona treatment, plasma treatment, flame treatment, ozone treatment, primer treatment, glow treatment, saponification treatment, or treatment with a coupling agent.

[Functional Thin-Film]

The functional thin-film 20 is formed on the transparent film substrate 10. The functional thin-film 20 is made of a stacked body of metal layers and metal oxide layers, and has a property of transmitting visible light and reflecting infrared rays. In the infrared reflecting film of the present invention, the functional thin-film 20 includes a metal oxide layer 21, an infrared reflecting layer 23 and a light absorptive metal layer 25 in this order from the transparent film substrate 10 side.

<Metal Oxide Layer>

The metal oxide layer 21 performs a function of enhancing the adhesion between the transparent film substrate 10 and the infrared reflecting layer 23. In a configuration that is provided with a metal layer of Ni—Cr or the like on the transparent film substrate, releasing is liable to occur at the interface between the transparent film substrate and the metal layer because of an influence by finger fat and the like. In contrast, by forming a metal oxide layer 21 on the cured resin layer 12 of the transparent film substrate 10, releasing at the interface tends to be suppressed. Therefore, it is preferable that the metal oxide layer 21 is formed on and in direct contact with the cured resin layer 12 of the transparent film substrate 10.

As a material of the metal oxide layer 21, a composite metal oxide containing zinc oxide and tin oxide is used. A metal oxide containing zinc oxide and tin oxide is excellent in chemical stability. Further, a metal oxide containing zinc oxide and tin oxide has a high adhesion to the cured resin layer 12 made of an acrylic compound or the like and also has a high adhesion to the infrared reflecting layer 23, so that the releasing at the interface is suppressed to enhance the durability of the infrared reflecting film.

The content of zinc atoms in the metal oxide layer 21 is preferably 10 atom % to 60 atom %, more preferably 15 atom % to 50 atom %, and further preferably 20 atom % to 40 atom %, with respect to the total amount of metal atoms. When the content of zinc atoms (zinc oxide) is small, the metal oxide layer becomes crystalline, and the durability may decrease. Further, when the content of zinc atoms (zinc oxide) is small, the resistance tends to become high, so that the electric conductivity of a sputtering target in deposition of the metal oxide layer by a sputtering method tends to decrease, making it difficult to deposit the metal oxide layer by DC sputtering. On the other hand, when the content of zinc atoms is excessively large, the adhesion to the cured resin layer 12 or the infrared reflecting layer 23 may decrease.

The content of tin atoms in the metal oxide layer 21 is preferably 30 atom % to 90 atom %, more preferably 40 atom % to 85 atom %, and further preferably 50 atom % to 80 atom %, with respect to the total amount of metal atoms. When the content of tin atoms (tin oxide) is excessively small, the chemical durability of the metal oxide layer tends to decrease. On the other hand, when the content of tin atoms (tin oxide) is excessively large, the resistance of the sputtering target used in deposition tends to become high, making it difficult to deposit the metal oxide layer by a DC sputtering method.

The metal oxide layer 21 may contain metals such as Ti, Zr, Hf, Nb, Al, Ga, In, Tl and Ga or metal oxides thereof in addition to zinc oxide and tin oxide. These metals or metal oxides can be added for the purpose of raising the electric conductivity of the target at the time of sputtering deposition to increase the deposition rate, enhancing the transparency of the metal oxide layer or the like purpose. A sum of the content of zinc atoms and the content of tin atoms in the metal oxide layer is preferably 40 atom % or more, more preferably 50 atom % or more, and further preferably 60 atom % or more, with respect to the total amount of metal atoms.

The thickness of the metal oxide layer 21 is preferably 2 nm or more, and more preferably 3 nm or more. When the thickness is 2 nm or more, the coverage of the metal oxide layer 21 on the transparent film substrate 10 becomes good, so that the adhesion tends to be enhanced. Although an upper limit of the thickness of the metal oxide layer 21 is not particularly limited, the metal oxide layer with a large thickness may cause decrease in the productivity by increase in the deposition time. Therefore, the thickness of the metal oxide layer 21 is preferably as small as possible within a range that can ensure the adhesion between the transparent film substrate and the infrared reflecting layer. Specifically, the thickness of the metal oxide layer 21 is preferably 15 nm or less, more preferably 10 nm or less, and further preferably 8 nm or less.

Although a method for forming the metal oxide layer 21 is not particularly limited, deposition by a dry process such as a sputtering method, a vacuum vapor deposition method, a CVD method or an electron beam vapor deposition method is preferable, since a thin-film having a uniform thickness can be formed. From the viewpoint of realizing a high deposition rate, the metal oxide layer 21 is preferably deposited by a DC sputtering method and, in particular, the metal oxide layer 21 is preferably deposited by a DC sputtering method using a target containing a metal and a metal oxide.

Since zinc oxide and tin oxide (particularly, tin oxide) have low electrical conductivity, a metal oxide target formed by sintering only these metal oxides has low electrical conductivity. When such a target is used for DC sputtering, there is a tendency that discharge does not occur or performing deposition stably for a long time is difficult. On the other hand, reactive sputtering using a metal target containing zinc and tin is carried out in an oxygen atmosphere, an excessive amount of oxygen in the metal oxide layer may oxidize the infrared reflecting layer formed thereon to decrease the infrared reflecting properties. In contrast, when the metal oxide is deposited by a DC sputtering method using a target containing a metal and a metal oxide, a high deposition rate can be realized, and adverse effects brought about by an excessive amount of oxygen are suppressed.

The target containing a metal and a metal oxide can be formed by sintering a metal of preferably 0.1 wt % to 20 wt %, more preferably 0.2 wt % to 15 wt %, together with zinc oxide and/or tin oxide. When the metal content at the time of forming the target is excessively small, the electric conductivity of the target becomes insufficient, whereby the deposition by DC sputtering may become difficult, or the adhesion between the metal oxide layer and the infrared reflecting layer or the like may decrease. When the metal content at the time of forming the target is excessively large, the amount of a remaining metal unoxidized during the sputtering deposition or the amount of a metal oxide whose oxygen content is less than the stoichiometric composition is increased, and this tends to cause a reduction of visible light transmittance of the metal oxide layer. A metal powder in the target forming material may be a powder of metal other than metal zinc and metal tin; however, the target forming material preferably contains at least any one among metal zinc and metal tin, and particularly preferably contains metal zinc. Since the metal powder used in the target forming material is oxidized by sintering, the metal powder in the target forming material may exist as a metal oxide in a sintered target.

A substrate temperature during deposition of the metal oxide layer 21 by sputtering is preferably lower than a heatresistant temperature of the transparent film substrate. The substrate temperature is preferably, for example, 20° C. to 160° C., and more preferably 30° C. to 140° C. A power density during sputtering deposition is preferably, for example, 0.1 W/cm$^2$ to 10 W/cm$^2$, more preferably 0.5 W/cm$^2$ to 7.5 W/cm$^2$, and further preferably 1 W/cm$^2$ to 6 W/cm$^2$. A process pressure during deposition is preferably, for example, 0.01 Pa to 10 Pa, more preferably 0.05 Pa to 5 Pa, and further preferably 0.1 Pa to 1 Pa. When the process pressure is excessively high, a deposition rate tends to decrease, and in contrast, when the pressure is excessively low, discharge tends to be unstable.

<Infrared Reflecting Layer>

The infrared reflecting layer 23 performs a function of imparting heat shielding properties by reflecting near-infrared rays and imparting heat insulating properties by reflecting far-infrared rays.

It is preferable that the infrared reflecting film of the present invention does not have a metal layer between the transparent film substrate 10 and the infrared reflecting layer 23. As described above, since a metal oxide layer 21 of ZTO or the like is provided on the transparent film substrate 10 in the present invention, the adhesion between the transparent film substrate 10 and the infrared reflecting layer 23 is enhanced, so that there is no particular need to provide a metal layer (primer layer) such as Ni—Cr. Since no metal layer is disposed between the transparent film substrate 10 and the infrared reflecting layer 23, the visible light transmittance of the infrared reflecting film can be improved. Further, there is no need to form a metal layer between the transparent film substrate 10 and the infrared reflecting layer 23, so that the number (kinds) of thin-films constituting the functional thin-film 20 as well as the total thickness thereof are reduced, thereby enhancing the productivity of the infrared reflecting film.

From the above viewpoints, the infrared reflecting layer 23 is preferably formed so as to be in direct contact with the metal oxide layer 21. A metal layer composed mainly of silver is used as the infrared reflecting layer 23. Since silver has a high free electron density, it can realize a high reflectance of near-infrared rays and far-infrared rays to attain an infrared reflecting film which is excellent in the heat shielding effect and the heat insulating effect.

The content of silver in the infrared reflecting layer 23 is preferably 90 wt % or more, more preferably 93 wt % or more, further preferably 95 wt % or more. The wavelength selectivity of the transmittance and the reflectance can be enhanced and the visible light transmittance of the infrared reflecting film can be increased by increasing the content of silver in the metal layer.

The infrared reflecting layer 23 may be a silver alloy layer containing metal other than silver. For example, in order to increase the durability of the infrared reflecting layer, a silver alloy may be used. As the metal added for the purpose of increasing the durability, palladium (Pd), gold (Au), copper (Cu), bismuth (Bi), germanium (Ge), gallium (Ga) and the like are preferred. Among these metals, Pd is most suitably used from the viewpoint of imparting high durability to silver. When an addition amount of Pd or the like is increased, the durability of the metal layer tends to increase. When the infrared reflecting layer 23 contains metal such as Pd other than silver, the content of the metal is preferably 0.1 wt % or more, more preferably 0.5 wt % or more, further preferably 1 wt % or more, and particularly preferably 2 wt % or more. On the other hand, when the addition amount of Pd or the like is increased and the content of silver is decreased, the visible light transmittance of the infrared reflecting film tends to decrease. Therefore, the content of metal other than silver in the infrared reflecting layer 23 is preferably 10 wt % or less, more preferably 7 wt % or less, further preferably 5 wt % or less.

From the viewpoint of allowing the infrared reflecting film to have sufficient heat shielding properties and heat insulating properties, the thickness of the infrared reflecting layer 23 is preferably 3 nm or more, more preferably 5 nm or more, and further preferably 10 nm or more. An upper limit of the thickness of the infrared reflecting layer 23 is not particularly limited. In consideration of the visible light transmittance and the productivity, the thickness of the infrared reflecting layer 23 is preferably 30 nm or less, more preferably 25 nm or less, and further preferably 20 nm or less.

Although the method for forming the infrared reflecting layer 23 is not particularly limited, a dry process such as a sputtering method, a vacuum vapor deposition method, a CVD method or an electron-beam deposition method is preferred. Particularly, it is preferred to form the infrared reflecting layer 23 by the DC sputtering method, as with the formation of the metal oxide layer 21.

<Light Absorptive Metal Layer>

The light absorptive metal layer 25 is formed on the infrared reflecting layer 23. The light absorptive metal layer 25 functions as a protective layer for the infrared reflecting layer 23 and performs a function of reducing the visible light reflectance to enhance the visibility of a window glass or the like that is provided with the infrared reflecting film.

As the light absorptive metal layer 25, a metal layer containing at least one selected from the group consisting of nickel (Ni), chromium (Cr), niobium (Nb), tantalum (Ta) and titanium (Ti) is used. Among these, a material of the light absorptive metal layer is preferably a metal containing Ni and/or chromium, particularly preferably a Ni—Cr alloy, from the viewpoint of enhancing the property of protecting the infrared reflecting layer. A sum of the content of Ni and the content of Cr in the Ni—Cr alloy is preferably 50 wt % or more, more preferably 60 wt % or more, further preferably 70 wt % or more, and particularly preferably 80 wt % or more. The Ni—Cr alloy may contain other metals such as Ta, Ti, Fe, Mo, Co, Cu and W in addition to Ni and Cr.

The thickness of the light absorptive metal layer 25 is preferably 2 nm or more, more preferably 3 nm or more. When the thickness of the light absorptive metal layer 25 is 2 nm or more, the property of protecting the infrared reflecting layer 23 is enhanced to suppress degradation of the infrared reflecting layer 23, and also the visibility of the infrared reflecting film is improved by reduction of the reflectance. On the other hand, when the thickness of the light absorptive metal layer 25 increases, absorption of visible light by the light absorptive metal layer increases, and the visible light transmittance (transparency) of the infrared reflecting film tends to decrease. Therefore, the thickness of the light absorptive metal layer 25 is preferably 15 nm or less, more preferably 10 nm or less, further preferably 8 nm or less, and particularly preferably 6 nm or less.

Although the method for forming the light absorptive metal layer 25 is not particularly limited, a dry process such as a sputtering method, a vacuum vapor deposition method, a CVD method or an electron-beam deposition method is preferred. Particularly, it is preferred to form the light absorptive metal layer 25 by the DC sputtering method, as with the formation of the metal oxide layer 21 and the infrared reflecting layer 23. In the case where all of the metal oxide layer 21, infrared reflecting layer 23 and the light absorptive metal layer 25 that constitute the functional thin-film 20 are deposited by DC sputtering, it is effective to use a roll-to-roll sputtering apparatus provided with a plurality of deposition chambers since these layers can be formed in one path process. Therefore, the productivity of the infrared reflecting film can be greatly improved.

<Overall Configuration of Functional Thin-Film and Thickness>

In the infrared reflecting film of the present invention, a sum of the thickness of the metal layers (infrared reflecting layer 23 and light absorptive metal layer 25) and the thickness of the metal oxide layers 21 formed on the transparent film substrate 10, i.e., the thickness of the functional thin-film 20, is preferably 50 nm or less, more preferably 40 nm or less, and further preferably 35 nm or less. As described above, the metal oxide layers and the metal layers are deposited by a dry process such as sputtering. In a dry process, the deposition time increases in proportion to the thickness, so that, according as the total thickness is smaller, the deposition can be carried out for a shorter period of time to enhance the productivity of the infrared reflecting film.

In conventional infrared reflecting film, a stacked body that is front-back symmetric with an infrared reflecting layer placed at the center, i.e., a stack of metal layer/metal oxide layer/infrared reflecting layer/metal oxide layer/metal layer; metal oxide layer/infrared reflecting layer/metal oxide layer; and the like, is generally formed on a film substrate. In contrast, in the infrared reflecting film of the present invention, a metal layer is not formed between the infrared reflecting layer 23 and the transparent film substrate 10, and an asymmetric stacked body (functional thin-film 20) having the light absorptive metal layer 25 on the infrared reflecting layer 23 is provided on the transparent film substrate 10.

In the infrared reflecting film of the present invention, the functional thin-film 20 having an asymmetric stacking configuration is provided with the metal oxide layer 21 of ZTO or the like on the surface of the infrared reflecting layer 23 at the transparent film substrate 10 side. With this configuration, the adhesion between the metal oxide layer 21 and the infrared reflecting layer 23 is enhanced, and releasing at the interface is suppressed even when a finger fat or the like penetrates into the infrared reflecting film. On the other hand, by providing the light absorptive metal layer 25 of Ni—Cr or the like on the front surface of the infrared reflecting layer 23 (transparent protective layer 30 side in FIG. 1), the durability of the infrared reflecting layer 23 is enhanced, and the visible light reflectance can be reduced. Thus, in the infrared reflecting film of the present invention, the functional thin-film 20 is formed to be front-back asymmetric and allowed to have respectively particularized functions, whereby the total thickness of the metal layers and the metal oxide layers is reduced to enhance the productivity of the infrared reflecting film. In addition, the releasing between the infrared reflecting layer 23 and the transparent film substrate 10 is suppressed, so that the degradation of the infrared reflecting layer 23 is further suppressed.

Further, the infrared reflecting film of the present invention does not have a metal layer between the transparent film substrate 10 and the infrared reflecting layer 23, and the metal layer is provided only on the front surface of the infrared reflecting layer 23. Therefore, as compared with the case where a light absorptive metal layer is provided on both of the film substrate side and the front side of the infrared reflecting layer 23, the total thickness of the light absorptive metal layers can be reduced without degrading the protection performance on the infrared reflecting layer 23, so that the absorption of visible light by the functional thin-film 20 can be suppressed to enhance the visible light transmittance.

Figure 2:
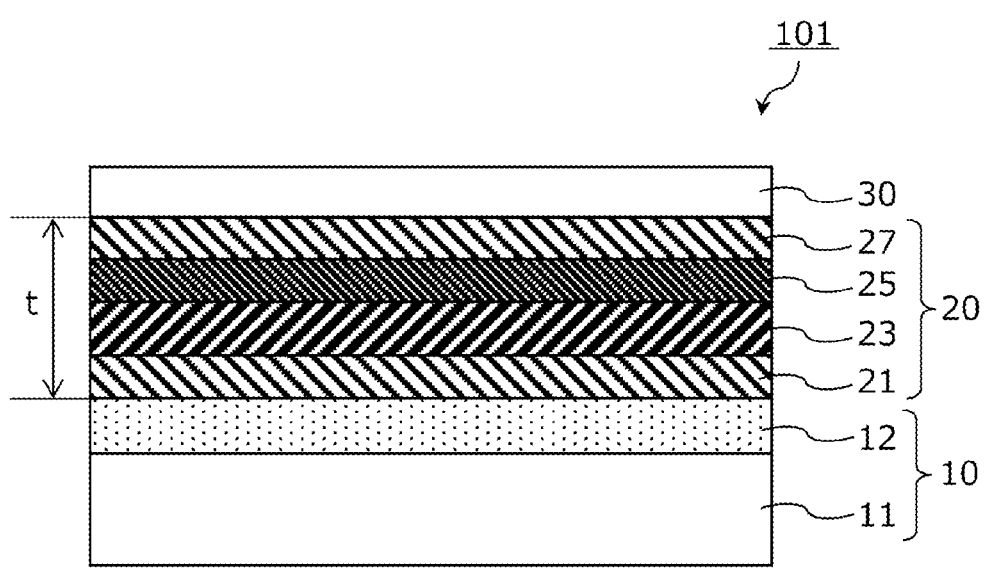
FIG. 2 is a schematic cross-sectional view showing a stacking configuration of an infrared reflecting film according to one embodiment.

Referring to FIG. 2, the functional thin-film 20 may further include other layers 27 (for example, a metal layer or a metal oxide layer) on the light absorptive metal layer 25. For example, a metal oxide layer 27 may be formed on the light absorptive metal layer 25 for the purpose of enhancing the adhesion between the functional thin-film 20 and the transparent protective layer 30 formed thereon. In this embodiment, the thickness of the metal oxide layer 27 is preferably 2 nm to 15 nm, more preferably 3 nm to 10 nm, and further preferably 3 nm to 8 nm. In an embodiment as shown in FIG. 2, in which the metal oxide layer 27 is provided on the light absorptive metal layer 25, the total thickness of the functional thin-film 20 including this metal oxide layer 27 is preferably 50 nm or less, more preferably 40 nm or less, and further preferably 35 nm or less.

When a metal layer or a metal oxide layer is further formed on the light absorptive metal layer 25, the deposition method thereof is not particularly limited. Deposition by a dry process is preferable, and above all, the deposition is preferably carried out by a DC sputtering method. It is to be noted that when a metal layer of Ni—Cr or the like serving as a deposition underlay is oxidized in formation of the metal oxide layer 27 on the light absorptive metal layer, the absorption of near-infrared rays and far-infrared rays increase, and the heat shielding properties and the heat insulating properties of the infrared reflecting film tend to decrease. Therefore, in deposition of the metal oxide layer 27 on the light absorptive metal layer 25 by sputtering, it is preferable to carried out the deposition under conditions with small oxygen introduction amount in the same manner as in deposition of the metal oxide layer 21 on the transparent film substrate 10. For example, when ZTO as the metal oxide layer 27 is formed by DC sputtering, the oxygen introduction amount into a deposition chamber is preferably 8 vol % or less, more preferably 5 vol % or less, and further preferably 4 vol % or less, with respect to the total flow rate of the introduced gases.

[Transparent Protective Layer]

It is preferable to provide a transparent protective layer 30 on the functional thin-film 20 for the purpose of preventing abrasion and degradation of the infrared reflecting layer. The transparent protective layer 30 preferably has low absorption of far-infrared rays in addition to having a high visible light transmittance. When the absorption of far-infrared rays is high, indoor far-infrared rays are absorbed by the transparent protective layer, and heat is dissipated to the outside by thermal conduction without being reflected by the infrared reflecting layer, so that the heat insulating properties tend to decrease. On the other hand, when the absorption of far-infrared rays by the transparent protective layer 30 is low, indoor far-infrared rays are reflected to the interior of the room by the infrared reflecting layer 23, so that the heat insulating properties are enhanced. Examples of method for reducing the far-infrared ray absorption amount by the transparent protective layer 30 include: using a material having a small far-infrared ray absorption as a material of the transparent protective layer; and reducing the thickness of the transparent protective layer.

When a material having a small far-infrared ray absorption is used as a material of the transparent protective layer, the far-infrared ray absorption amount can be kept low even when the thickness of the transparent protective layer is large, so that the protection effect on the infrared reflecting layer can be enhanced. As the material having low far-infrared absorption, a compound in which the content of a C=C bond, a C=O bond, a C—O bond and an aromatic ring is low, is suitably used, and for example, polyolefins such as polyethylene and polypropylene; alicyclic polymers such as cycloolefin-based polymer; and rubber-based polymer are suitably used.

In the case where the far-infrared ray absorption amount is reduced by adjusting the thickness of the transparent protective layer 30, the thickness of the transparent protective layer is preferably 200 nm or less, more preferably 150 nm or less, further preferably 120 nm or less, and particularly preferably 100 nm or less. When the optical thickness (product of the refractive index and the physical thickness) of the transparent protective layer overlaps with the wavelength range of visible light, an "iris phenomenon" that the surface of the infrared reflecting film gives the appearance of a rainbow pattern by the multiplex reflection interference at an interface may occur. Since the refractive index of a general resin is about 1.5, the thickness of the transparent resin layer is preferably within the above-described range from the viewpoint of suppressing the iris phenomenon as well.

On the other hand, from the viewpoint of imparting mechanical strength and chemical strength to the transparent protective layer to increase the durability of the infrared reflecting film, the thickness of the transparent protective layer 30 is preferably 20 nm or more, more preferably 30 nm or more, and further preferably 50 nm or more.

In addition, when the thickness of the transparent protective layer 30 is in the above range, the visible light reflectance can be reduced by multiplex reflection interference of reflected light on the surface side of the transparent protective layer 30 and reflected light at an interface on the functional thin-film 20 side. Therefore, an anti-reflection effect by the transparent protective layer 30 is obtained in addition to the reflectance reduction effect by light absorption of the light absorptive metal layer 25, so that the visibility of the infrared reflecting film can be further enhanced.

A material having a high visible light transmittance and being excellent in mechanical strength and chemical strength is preferable as a material of the transparent protective layer 30. For example, active ray-curable or thermosetting organic resins such as fluorine-based, acryl-based, urethane-based, ester-based, epoxy-based and silicone-based resins; inorganic materials such as silicon oxide, silicon nitride, silicon oxynitride, aluminum oxide, titanium oxide, zirconium oxide and sialon (SiAlON); or organic-inorganic hybrid materials in which an organic component is chemically coupled with an inorganic component are preferably used.

When an organic material or an organic-inorganic hybrid material is employed as a material of the transparent protective layer 30, it is preferred to introduce a cross-linked structure. When the cross-linked structure is formed in the transparent protective layer, mechanical strength and chemical strength of the transparent protective layer are increased, and a function of protecting the infrared reflecting layer is increased. Among others, it is preferred to introduce a cross-linked structure derived from an ester compound having an acid group and a polymerizable functional group in a molecule.

Examples of the ester compound having an acid group and a polymerizable functional group in one molecule include esters of polyhydric acids such as phosphoric acid, sulfuric acid, oxalic acid, succinic acid, phthalic acid, fumaric acid and maleic acid; with a compound having, in a molecule, a hydroxyl group and a polymerizable functional group such as ethylenic unsaturated groups, silanol groups or epoxy groups. Although the polymerizable ester compound may be a polyhydric ester such as diester or triester, it is preferred that at least one acid group of a polyhydric acid is not esterified.

When the transparent protective layer 30 has a cross-linked structure derived from the above ester compound, the mechanical strength and the chemical strength of the transparent protective layer are enhanced, and further the adhesion between the transparent protective layer 30 and the functional thin-film 20 is enhanced, so that the durability of the infrared reflecting layer can be enhanced. Among the above ester compounds, an ester compound of phosphoric acid and an organic acid having a polymerizable functional group (phosphate ester compound) are particularly preferable, since they are excellent in adhesion to the functional thin-film 20.

From the viewpoint of enhancing mechanical strength and chemical strength of the transparent protective layer 30, the above ester compound preferably contains a (meth)acryloyl group as the polymerizable functional group. Further, from the viewpoint of facilitating introduction of the cross-linked structure, the above ester compound may have a plurality of polymerizable functional groups in the molecule. As the above ester compound, for example, a phosphate monoester compound or a phosphate diester compound represented by the following formula (1) is suitably used. The phosphate monoester may be used in combination with the phosphate diester.

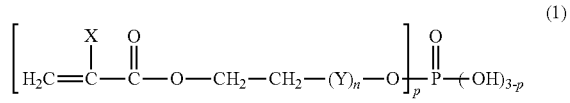

(1)

In the above formula, X represents a hydrogen atom or a methyl group, and (Y) represents a —OCO(CH$_2$)$_5$— group. n is 0 or 1, p is 1 or 2.

The content of the structure derived from the above ester compound in the transparent protective layer 30 is preferably 1 to 20 wt %, more preferably 1.5 to 17.5 wt %, further preferably 2 to 15 wt %, and particularly preferably 2.5 to 12.5 wt %. When the content of the structure derived from the ester compound is excessively small, the effect of improving the strength or the adhesion may not be adequately achieved. On the other hand, when the content of the structure derived from the ester compound is excessively large, a curing rate during formation of the transparent protective layer may be low, resulting in a reduction of the hardness of the layer, or slip properties of the surface of the transparent protective layer may be deteriorated, resulting in a reduction of abrasion-resistance. The content of the structure derived from the ester compound in the transparent protective layer can be set to a desired range by adjusting the content of the above ester compound in a composition in formation of the transparent protective layer.

When the transparent protective layer 30 contains a structure derived from the above-mentioned ester compound, it is preferable that the functional thin-film 20 includes a metal oxide layer 27 on the light absorptive metal layer 25, as shown in FIG. 2. When the functional thin-film 20 includes the metal oxide layer 27 at the interface on the transparent protective layer 30 side, the adhesion between the functional thin-film 20 and the transparent protective layer 30 tends to be further enhanced. It is estimated that an improvement of the adhesion between the transparent protective layer 30 and the metal oxide layer 27 is derived from the fact that an acid group in the ester compound exhibits high compatibility with a metal oxide, and in particular, a hydroxyl group of phosphoric acid in the phosphate ester compound has excellent compatibility with a metal oxide layer, thereby improving the adhesion.

From the viewpoint of enhancing the adhesion between the functional thin-film 20 and the transparent protective layer 30 and further imparting a chemical stability to the infrared reflecting layer, a composite metal oxide containing zinc oxide and tin oxide, as with the metal oxide layer 21 disposed between the transparent film substrate 10 and the infrared reflecting layer 23, is preferably used as a material of the metal oxide layer 27 formed on the light absorptive metal layer 25. When a composite metal oxide layer containing zinc oxide and tin oxide is formed as the metal oxide layer 27, conditions similar to those described above with respect to the metal oxide layer 21 are preferably adopted as the composition and the method of deposition of the composite metal oxide layer.

A method for forming the transparent protective layer 30 is not particularly limited. The transparent protective layer is preferably formed by dissolving, for example, an organic resin, or a curable monomer or an oligomer of an organic resin and the above-mentioned ester compound in a solvent to prepare a solution, applying the solution onto the functional thin-film 20, removing the solvent by evaporation, and curing the rest by ultraviolet or electron irradiation or addition of heat energy.

The material of the transparent protective layer 30 may include additives such as coupling agents (silane coupling agent, titanium coupling agent, etc.), leveling agents, ultraviolet absorbers, antioxidants, heat stabilizers, lubricants, plasticizers, coloring inhibitors, flame retarders and antistatic agents in addition to the above-mentioned organic materials, inorganic materials and ester compounds. The contents of these additives can be appropriately adjusted to an extent which does not impair the object of the present invention.

[Properties of Infrared Reflecting Film]

In the infrared reflecting film of the present invention, a normal emittance measured from the functional thin-film 20 side (or the transparent protective layer 30 side) is preferably 0.20 or less, more preferably 0.15 or less, further preferably 0.12 or less, and particularly preferably 0.10 or less.

The visible light transmittance of the infrared reflecting film is preferably 10% or more, more preferably 20% or more, further preferably 25% or more, and particularly preferably 30% or more. In the meantime, from the viewpoint of enhancing the heat shielding properties, the visible light transmittance is preferably 50% or less, more preferably 45% or less, and further preferably 40% or less. As described above, since the infrared reflecting film of the present invention includes a light absorptive metal layer 25 only on the infrared reflecting layer 23 at a surface opposite to the transparent film substrate 10 side, reflection of visible light can be suppressed while absorption of visible light is suppressed, thereby setting the visible light transmittance to be within the above-mentioned range. In the infrared reflecting film of the present invention, the visible light reflectance is preferably 40% or less, more preferably 35% or less, and further preferably 30% or less.

[Usage]

As described above, the infrared reflecting film of the present invention has a functional thin-film 20 including the metal oxide layer 21, the infrared reflecting layer 23 and the light absorptive metal layer 25, on one main surface of the transparent film substrate 10. The infrared reflecting film of the present invention can be used for windows of buildings, vehicles or the like, transparent cases for botanical companions or the like, or showcases of freezing or cold storage, to cause the effects of cooling/heating and to prevent rapid changes in temperature.

As described before with reference to FIG. 3, the infrared reflecting film 100 of the present invention produces a heat-shielding effect and a heat insulating effect by transmitting and introducing indoors the visible light (VIS) from the outdoors and reflecting the near-infrared rays (NIR) from the outdoors with the functional thin-film 20 including the infrared reflecting layer. Further, the infrared reflecting film of the present invention has a light absorptive metal layer and thus visible light reflectance is reduced. When the infrared reflecting film is used for a display case, a store window or the like, the heat shielding properties and the heat insulating properties can be imparted without degrading the visibility of commercial products and the like.

A surface opposite to the functional thin-film 20-forming surface of the transparent film substrate 10 may be provided with an adhesive layer 60 or the like to be used for bonding the infrared reflecting film to a window glass or the like. As the adhesive layer, an adhesive having a high visible light transmittance and a small difference in refractive index with the transparent film substrate 10 is suitably used. For example, an acryl-based pressure sensitive adhesive is suitable as a material of the adhesive layer provided for the transparent film substrate, since it has excellent optical transparency, exhibits appropriate wettability, cohesive property, and adhesion properties, and is excellent in weatherability and heat resistance.

The adhesive layer preferably has a high visible light transmittance and low ultraviolet transmittance. The degradation of the infrared reflecting layer caused by ultraviolet rays of the sunlight or the like can be suppressed by reducing the ultraviolet transmittance of the adhesive layer. From the viewpoint of reducing the ultraviolet transmittance of the adhesive layer, the adhesive layer preferably contains an ultraviolet absorber. The degradation of the infrared reflecting layer caused by ultraviolet rays from the outdoors can also be suppressed by using a transparent film substrate containing an ultraviolet absorber. An exposed surface of the adhesive layer is preferably temporarily attached with a separator to be covered for the purpose of preventing the contamination of the exposed surface until the infrared reflecting film is put into practical use. This can prevent the contamination of the exposed surface of the adhesive layer due to contact with external during usual handling.

The infrared reflecting film of the present invention may also be used by being inserted and fitted into a frame body or the like as disclosed, for example, in JP 2013-61370 A. In this usage, there is no need to add and attach an adhesive layer to the transparent film substrate 10, so that absorption of far-infrared rays by the adhesive layer does not occur. Therefore, by using a material (for example, cyclic polyolefin) having a small content of functional groups such as a C=C bond, a C=O bond, a C—O bond or an aromatic ring as the transparent film substrate 10, the far-infrared rays from the transparent film substrate 10 side can be reflected by the infrared reflecting layer 23, so that the heat insulating properties can be imparted to both sides of the infrared reflecting film. Such a configuration is particularly useful, for example, in a cold-storage display case, a freezer display case or the like.

EXAMPLE

The present invention will be described more specifically below by showing examples, but the present invention is not limited to these examples.

[Measuring Methods Applied in the Examples and Comparative Examples]

<Thickness of Each Layer>

A thickness of each of the metal layer, metal oxide layer and the transparent protective layer was determined by machining a sample by a focused ion beam (FIB) method using a focused ion beam machining observation device (manufactured by Hitachi, Ltd., trade name "FB-2100"), and observing a cross-section of the sample using a field emission transmission electron microscope (manufactured by Hitachi, Ltd., trade name "HF-2000"). Thickness of the hard coat layer formed on the substrate was determined by calculation from an interference pattern of visible light reflectance in allowing light to enter from a measuring object side by using an instantaneous multi-photometric system (manufactured by Otsuka Electronics Co., Ltd., trade name "MCPD3000").

<Visible Light Transmittance and Reflectance>

The visible light transmittance and reflectance were measured by using a spectral photometer (trade name "U-4100" manufactured by Hitachi High-Technologies Corporation). In measurement, a surface on a transparent film substrate side of an infrared reflecting film was bonded to a 3 mm thick glass plate with a 25 µm thick pressure sensitive adhesive layer interposed therebetween to form a sample for measurement. The transmittance was calculated in accordance with a transmittance calculation method of JIS A5759-2008 (Adhesive films for glazings). Regarding the reflectance, light was made to be incident at an incidence angle of 5° from the transparent protective layer side (Ni—Cr layer side in Example 2), and a 5° absolute reflectance within a wavelength range of 380 nm to 780 nm was measured.

<Finger Fat Immersion Test>

A surface of the infrared reflecting film at the transparent film substrate side was bonded to a glass plate of 3 cm×3 cm with an adhesive layer having a thickness of 25 µm interposed therebetween, so as to prepare a sample. This sample was immersed into an artificial finger fat liquid (aqueous solution containing 0.1 wt % of urea, 0.5 wt % of lactic acid, 0.8 wt % of sodium pyrophosphate, 0.7 wt % of sodium chloride and 2 vol % of ethanol). After being left to stand quietly in an environment of 50° C. for 10 days, the sample was taken out, and the presence or absence of releasing of the infrared reflecting layer and an appearance thereof were observed by eye inspection.

Example 1

In Example 1, an infrared reflecting film including, on a transparent film substrate having a hard coat layer, a metal oxide layer made of ZTO, an Ag—Pd metal layer (infrared reflecting layer) and a Ni—Cr metal layer and further including a transparent resin protective layer thereon was prepared by a method described below.

(Formation of Hard Coat Layer on Substrate)

An acryl-based ultraviolet-cured hard coat layer (manufactured by Nippon Soda Co., Ltd., NH2000G) was formed in a thickness of 2 µm on one surface of a polyethylene terephthalate film (manufactured by Toray Industries Inc., trade name "Lumirror U48", visible light transmittance 93%) having a thickness of 50 µm. Specifically, a hard coat solution was applied with a gravure coater, dried at 80° C., and irradiated with ultraviolet rays of accumulated light quantity of 300 mJ/cm$^2$ by an ultra-high pressure mercury lamp to be cured.

(Formation of Metal Layer and Metal Oxide Layer)

On the hard coat layer of the polyethylene terephthalate film substrate, a zinc-tin composite oxide (ZTO) layer having a thickness of 4 nm, an Ag—Pd alloy layer (infrared reflecting layer) having a thickness of 16 nm, and a Ni—Cr alloy layer having a thickness of 5 nm were formed in this order by a DC magnetron sputtering method using a roll-to-roll sputtering apparatus. A target formed by sintering zinc oxide, tin oxide and metal zinc powder in a weight ratio of 8.5:83:8.5 was used for deposition of the ZTO layer, and sputtering was carried out under conditions with a power density of 2.67 W/cm$^2$, a process pressure of 0.4 Pa and a substrate temperature of 80° C. During the deposition, the gas introduction amount into the sputtering deposition chamber was adjusted so that the ratio Ar:$O_2$ would be 98:2 (volume ratio). A metal target containing silver:palladium in a weight ratio of 96.4:3.6 was used for deposition of the Ag—Pd layer. A metal target containing nickel:chromium in a weight ratio of 80:20 was used for deposition of the Ni—Cr layer.

(Formation of Transparent Protective Layer)

On the Ni—Cr layer, a transparent protective layer composed of a fluorine-based ultraviolet-curable resin having a cross-linked structure derived from a phosphate ester compound was formed in a thickness of 70 nm. Specifically, a solution prepared by adding 5 parts by weight of a phosphate ester compound (manufactured by Nippon Kayaku Co., Ltd., trade name "KAYAMER PM-21") to 100 parts by weight of a solid content of an fluorine-based hard coat resin solution (trade name "JUA 204", manufactured by JSR Corporation) was applied by using an applicator, dried at 60° C. for 1 minute, and irradiated with ultraviolet rays of accumulated light quantity of 400 mJ/cm$^2$ by an ultra-high pressure mercury lamp in a nitrogen atmosphere to be cured. The phosphate ester compound above is a mixture of a phosphate monoester compound (compound represented by the formula (1), wherein X is a methyl group, n=0, and p=1) having one acryloyl group in one molecule and a phosphate diester compound (compound represented by the formula (1), wherein X is a methyl group, n=0, and p=2) having two acryloyl groups in one molecule.

Example 2

An infrared reflecting film was prepared in the same manner as in Example 1 except that the transparent protective layer was not formed on the Ni—Cr metal layer.

Examples 3 and 4

Infrared reflecting films were prepared in the same manner as in Example 1 except that the thicknesses of the Ni—Cr metal layers were changed as shown in Table 1.

Example 5

A ZTO layer having a thickness of 4 nm was formed on a Ni—Cr layer, and a transparent protective layer was formed thereon. An infrared reflecting film was prepared in the same manner as in Example 1 except for the above changes. The conditions for deposition of the ZTO layer on the Ni—Cr layer were set to be same as the conditions for deposition of ZTO on the transparent film substrate.

Comparative Example 1

In Comparative Example 1, ZTO was not deposited on the film substrate, and a Ni—Cr alloy layer having a thickness of 4 nm was instead deposited. Thereon, an Ag—Pd layer having a thickness of 16 nm and a Ni—Cr metal layer having a thickness of 4 nm were deposited. Further thereon, a transparent resin protective layer was formed in the same manner as in Example 1, so as to prepare an infrared reflecting film.

Comparative Examples 2 to 4

ZTO was not deposited on the film substrate, and an indium-tin composite oxide (ITO) layer (Comparative Example 2), an indium-zinc composite oxide (IZO) layer (Comparative Example 3) and a niobium oxide ($Nb_2O_5$) layer (Comparative Example 4) having a thickness of 6 nm were instead deposited, respectively. Infrared reflecting films were prepared in the same manner as in Example 1 except for the above changes.

Comparative Example 5

The thickness of the ZTO layer was changed to 6 nm, and the thickness of the Ni—Cr layer was changed to 1 nm. An infrared reflecting film was prepared in the same manner as in Example 1 except for the above changes.

Comparative Examples 6, 7

The thickness of the ZTO layer was changed to 6 nm, and a ZTO layer having a thickness of 15 nm (Comparative Example 6) or having a thickness of 30 nm (Comparative Example 7) was deposited in place of the Ni—Cr layer. An infrared reflecting film was prepared in the same manner as in Example 1 except for the above changes.

Comparative Example 8

A Ni—Cr layer having a thickness of 2 nm was formed between the ZTO layer and the Ag—Pd layer, and the thickness of the Ni—Cr layer on the Ag—Pd layer was changed to 1 nm. An infrared reflecting film was prepared in the same manner as in Example 1 except for the above changes.

[Evaluation]

Stacking configuration, reflectance and transmittance, and finger fat immersion test result of the infrared reflecting film of each of the Examples and the Comparative Examples described above are shown in Table 1. In Table 1, the numeral in the parentheses in the stacking configuration represents the thickness of each layer in nanometers, and t is a total thickness of the metal layers and the metal oxide layers. In the finger fat immersion test result, the case in which the infrared reflecting layer was released from the substrate is denoted as "Released"; the case in which discoloration (degradation) of the infrared reflecting layer (Ag alloy layer) was seen is denoted as "Degraded"; and the case in which neither the releasing nor the degradation was seen is denoted as "Good".

TABLE 1

| | Functional thin-film stacking configuration | t (nm) | Transparent protective layer | Finger fat immersion test | Transmittance (%) | Reflectance (%) |
|---|---|---|---|---|---|---|
| Example 1 | ZTO (4)/Ag—Pd (16)/Ni—Cr (5) | 25 | Present | Good | 30 | 26 |
| Example 2 | ZTO (4)/Ag—Pd (16)/Ni—Cr (5) | 25 | Absent | Good | 20 | 49 |
| Example 3 | ZTO (4)/Ag—Pd (16)/Ni—Cr (3) | 23 | Present | Good | 38 | 27 |
| Example 4 | ZTO (4)/Ag—Pd (16)/Ni—Cr (10) | 30 | Present | Good | 17 | 28 |
| Example 5 | ZTO (4)/Ag—Pd (16)/Ni—Cr (5)/ZTO (4) | 29 | Present | Good | 30 | 24 |
| Comparative Example 1 | Ni—Cr (4)/Ag—Pd (16)/Ni—Cr (4) | 24 | Present | Released | 25 | 33 |
| Comparative Example 2 | ITO (6)/Ap-Pd (16)/Ni—Cr (5) | 27 | Present | Released | 32 | 25 |
| Comparative Example 3 | IZO (6)/Ap-Pd (16)/Ni—Cr (5) | 27 | Present | Released | 32 | 25 |
| Comparative Example 4 | $Nb_2O_5$ (6)/Ap-Pd (16)/Ni—Cr (5) | 27 | Present | Released | 32 | 25 |
| Comparative Example 5 | ZTO (6)/Ag—Pd (16)/Ni—Cr (1) | 23 | Present | Degraded | 51 | 30 |
| Comparative Example 6 | ZTO (6)/Ag—Pd (16)/ZTO (15) | 37 | Present | Degraded | 62 | 29 |
| Comparative Example 7 | ZTO (6)/Ag—Pd (16)/ZTO (30) | 52 | Present | Good | 59 | 32 |
| Comparative Example 8 | ZTO (4)/Ni—Cr (2)/Ag—Pd (16)/Ni—Cr (1) | 23 | Present | Degraded | 39 | 31 |

From the results shown in Table 1, it will be understood that, despite the total thickness of the metal layers and the metal oxide layers being 30 nm or less, the infrared reflecting films of the Examples of the present invention are all excellent in durability without provoking the occurrence of the film releasing or the degradation of the infrared reflecting layer even after the finger fat immersion test. Even in Example 2 in which the infrared reflecting film does not have a transparent protective layer, a finger fat immersion test result equivalent to that of Example 1 was obtained. It can be stated that the improvement in durability provided by the present invention is attributable to the stacking configuration of the metal oxide layers and the metal layers.

In Comparative Example 1 in which the infrared reflecting film had only a Ni—Cr layer between the substrate film and the infrared reflecting layer, releasing occurred at the interface between the substrate film and the Ni—Cr layer after the finger fat immersion test. Equivalent results were obtained in Comparative Examples 2 to 4 in which the infrared reflecting film was provided with a metal oxide layer other than ZTO between the substrate film and the infrared reflecting layer. From these results, it will be understood that a composite metal oxide layer containing zinc oxide and tin oxide specifically performs a function of enhancing the adhesion between the substrate and the infrared reflecting layer.

In Comparative Example 5 in which a Ni—Cr layer having a thickness of 1 nm was formed on the infrared reflecting layer, no releasing occurred after the finger fat immersion test; however, degradation of the infrared reflecting layer was observed. Equivalent result was obtained in Comparative Example 8 in which a Ni—Cr layer was formed on both of the front and back surfaces of the infrared reflecting layer. In Example 3 and Comparative Example 8, a total thickness of the Ni—Cr layers is the same. However, in Comparative Example 8 in which the thickness of the Ni—Cr layer on the infrared reflecting layer was 1 nm, degradation of the infrared reflecting layer was observed, though the durability was good in Example 3 in which the infrared reflecting film had a Ni—Cr layer having a thickness of 3 nm only on one surface of the infrared reflecting layer. From these results, it will be understood that, in the present invention, the light absorptive metal layer on the infrared reflecting layer performs a function of suppressing degradation of silver that constitutes the infrared reflecting layer, and the thickness of the light absorptive metal layer is preferably 2 nm or more.

It is to be noted that, in Example 3 and Comparative Example 8, the visible light transmittance also exhibits an approximately equal value, since the total thickness of the Ni—Cr layers is the same. In other words, it will be understood that the configuration of the present invention, in which no metal layer is present between the film substrate and the infrared reflecting layer and in which the metal layer is provided only on the front surface side of the infrared reflecting layer, enhances the durability of the infrared reflecting film without decreasing the transparency as compared with the case in which a metal layer is provided on both surfaces of the infrared reflecting layer. The configuration of the present invention can reduce the number of stacked layers in the functional thin-film as compared with the configuration in which a metal layer is provided on both surfaces of the infrared reflecting layer, so that it can be stated that the configuration of the present invention gives a high productivity of the infrared reflecting film, and the durability, visible light transmittance and productivity are excellent.

Also in Comparative Example 6 in which ZTO having a thickness of 15 nm was formed on the infrared reflecting layer, the infrared reflecting layer was degraded after the finger fat immersion test as in Comparative Example 5. On the other hand, in Comparative Example 7 in which the thickness of ZTO on the infrared reflecting layer was increased to 30 nm, the result of the finger fat immersion test was good. However, it will be understood that, in Comparative Example 7, the total thickness of the functional thin-film exceeds 50 nm, thereby giving a poor productivity. On the other hand, in Example 3, a good result was obtained even though the thickness of the Ni—Cr layer is 3 nm. From these results, it will be understood that, in the case of forming a metal layer on the infrared reflecting layer, durability can be improved with a smaller thickness than in the case of forming a metal oxide layer, so that the former case gives an excellent productivity of the infrared reflecting film.

DESCRIPTION OF REFERENCE CHARACTERS

100, 101: infrared reflecting film
10: transparent film substrate
11: transparent film
12 cured resin layer
20 functional thin-film
21, 27: metal oxide layer
23: infrared reflecting layer
25: light absorptive metal layer
30: transparent protective layer
60: adhesive layer

The invention claimed is:

1. An infrared reflective coated substrate comprising:
a transparent film substrate; and
an infrared reflecting functional coating disposed on the transparent film substrate, the infrared reflecting functional coating comprising: a first metal oxide layer; an infrared reflecting metal layer mainly made of silver; and a light absorptive metal layer, in this order, wherein
the transparent film substrate includes a cured resin layer on a surface at a side where the infrared reflecting functional coating is disposed,
the cured resin layer and the first metal oxide layer are in direct contact with each other,
the first metal oxide layer is formed of a composite metal oxide containing zinc oxide and tin oxide,
the light absorptive metal layer has a thickness of 2 nm to 10 nm, and contains at least one selected from the group consisting of nickel, chromium, niobium, tantalum and titanium, and
no metal layer is deposited between the transparent film substrate and the infrared reflecting metal layer,
wherein the infrared reflective coated substrate has a visible light transmittance of 20% to 38% when measured according to the method set forth in JIS A5759-2008, and
wherein a sum of thicknesses of all metal layers and all metal oxide layers on the transparent film substrate is 50 nm or less.

2. The infrared reflective coated substrate according to claim 1, wherein the first metal oxide layer and the infrared reflecting metal layer are in direct contact with each other.

3. The infrared reflective coated substrate according to claim 1, wherein the first metal oxide layer has a thickness of 2 nm to 15 nm.

4. The infrared reflective coated substrate according to claim 1, further comprising a transparent resin layer on a surface of the light absorptive metal layer at a side opposite to the infrared reflecting metal layer.

5. The infrared reflective coated substrate according to claim 1, wherein the infrared reflecting functional coating further comprises a second metal oxide layer on a surface of the light absorptive metal layer at a side opposite to the infrared reflecting metal layer.

6. The infrared reflective coated substrate according to claim 5, further comprising a transparent resin layer on a surface of the second metal oxide layer at a side opposite to the light absorptive metal layer.

7. The infrared reflective coated substrate according to claim 1, wherein the infrared reflective coated substrate has a 5° absolute reflectance of 40% or less,
wherein the 5° absolute reflectance is measured within a wavelength range of 380 nm to 780 nm by making light incident on a sample in which a surface on the transparent film substrate of the infrared reflective coated substrate is bonded to a glass plate with a pressure sensitive adhesive layer interposed therebetween, the light being incident on a side opposite to the glass plate of the sample at an incidence angle of 5°.

8. The infrared reflective coated substrate according to claim 1, wherein the infrared reflecting metal layer has a thickness of 3 to 30 nm.

9. The infrared reflective coated substrate according to claim 7, wherein the 5° absolute reflectance of the infrared reflective coated substrate is 20% or more.

10. The infrared reflective coated substrate according to claim 1, wherein the infrared reflective coated substrate has a 5° absolute reflectance of 30% or less,
wherein the 5° absolute reflectance is measured within a wavelength range of 380 nm to 780 nm by making light incident on a sample in which a surface on the transparent film substrate of the infrared reflective coated substrate is bonded to a glass plate with a pressure sensitive adhesive layer interposed therebetween, the light being incident on a side opposite to the glass plate of the sample at an incidence angle of 5°.

11. The infrared reflective coated substrate according to claim 4, wherein the infrared reflective coated substrate has a 5° absolute reflectance of 30% or less,
wherein the 5° absolute reflectance is measured within a wavelength range of 380 nm to 780 nm by making light incident on a sample in which a surface on the transparent film substrate of the infrared reflective coated substrate is bonded to a glass plate with a pressure sensitive adhesive layer interposed therebetween, the light being incident on a side opposite to the glass plate of the sample at an incidence angle of 5°.

12. The infrared reflective coated substrate according to claim 4, wherein the transparent resin layer has a thickness of 20 nm to 200 nm.

13. The infrared reflective coated substrate according to claim 12, wherein the infrared reflective coated substrate has a 5° absolute reflectance of 30% or less,
wherein the 5° absolute reflectance is measured within a wavelength range of 380 nm to 780 nm by making light incident on a sample in which a surface on the transparent film substrate of the infrared reflective coated substrate is bonded to a glass plate with a pressure sensitive adhesive layer interposed therebetween, the light being incident on a side opposite to the glass plate of the sample at an incidence angle of 5°.

14. The infrared reflective coated substrate according to claim 4, wherein the transparent resin layer has a thickness of 20 nm to 100 nm.

15. The infrared reflective coated substrate according to claim 14, wherein the infrared reflective coated substrate has a 5° absolute reflectance of 30% or less,
wherein the 5° absolute reflectance is measured within a wavelength range of 380 nm to 780 nm by making light incident on a sample in which a surface on the transparent film substrate of the infrared reflective coated substrate is bonded to a glass plate with a pressure sensitive adhesive layer interposed therebetween, the light being incident on a side opposite to the glass plate of the sample at an incidence angle of 5°.

* * * * *